United States Patent
Lin et al.

(10) Patent No.: US 9,517,539 B2
(45) Date of Patent: Dec. 13, 2016

(54) WAFER SUSCEPTOR WITH IMPROVED THERMAL CHARACTERISTICS

(71) Applicant: Taiwan Semiconductor Manufacturing Company, Ltd., Hsin-Chu (TW)

(72) Inventors: Yi-Hung Lin, Taipei (TW); Jr-Hung Li, Chupei (TW); Chang-Shen Lu, New Taipei (TW); Tze-Liang Lee, Hsinchu (TW); Chii-Horng Li, Zhubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/471,772

(22) Filed: Aug. 28, 2014

(65) Prior Publication Data

US 2016/0064268 A1    Mar. 3, 2016

(51) Int. Cl.
*H01L 21/67* (2006.01)
*B23Q 3/18* (2006.01)
*C30B 25/12* (2006.01)
*H01L 21/687* (2006.01)

(52) U.S. Cl.
CPC .............. *B23Q 3/18* (2013.01); *C30B 25/12* (2013.01); *H01L 21/67109* (2013.01); *H01L 21/67115* (2013.01); *H01L 21/68735* (2013.01)

(58) Field of Classification Search
CPC ..................... H01L 2924/0002; H01L 2924/00
USPC ........................ 438/151, 689, 687, 782, 565
See application file for complete search history.

(56) References Cited

U.S. PATENT DOCUMENTS

| 7,393,418 B2 | 7/2008 | Yokogawa |
| 2004/0149226 A1* | 8/2004 | Chen .............................. 118/728 |
| 2007/0218664 A1* | 9/2007 | Ito ........................ C23C 16/4584 438/565 |
| 2007/0227441 A1 | 10/2007 | Narahara et al. |
| 2013/0252189 A1 | 9/2013 | Lin et al. |
| 2013/0252424 A1 | 9/2013 | Lin et al. |
| 2013/0256292 A1 | 10/2013 | Lin et al. |

FOREIGN PATENT DOCUMENTS

| JP | 2009-088088 | 4/2009 |
| KR | 20120051968 | 5/2012 |

OTHER PUBLICATIONS

Office Action dated Jan. 4, 2016 issued by Korean Patent Office in Korean Patent Application No. 10-2014-0193858, 10 pages.

* cited by examiner

*Primary Examiner* — Chuong A Luu
*Assistant Examiner* — Rodolfo Fortich
(74) *Attorney, Agent, or Firm* — Haynes and Boone, LLP

(57) ABSTRACT

A substrate-retaining device with improved thermal uniformity is provided. In an exemplary embodiment, the substrate-retaining device includes a substantially circular first surface with a defined perimeter, a plurality of contact regions disposed at the perimeter, and a plurality of non-contact regions also disposed at the perimeter. The contact regions are interspersed with the noncontact regions. Within each of the noncontact regions, the first surface extends past where the first surface ends within each of the contact regions. In some such embodiments, each region of the plurality of contact regions includes a contact surface disposed above the first surface.

20 Claims, 13 Drawing Sheets

WAFER SUSCEPTOR WITH IMPROVED THERMAL CHARACTERISTICS

BACKGROUND

The semiconductor integrated circuit (IC) industry has experienced rapid growth. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. However, such scaling down has also been accompanied by increased complexity in design and manufacturing of devices incorporating these ICs, and, for these advances to be realized, similar developments in device design are needed.

For example, epitaxy is a common technique for depositing material, often used in the fabrication of integrated circuits, that is ripe for improvement. Epitaxy may be used to grow semiconductor crystals as well as other crystalline structures. In a conventional vapor-phase epitaxial process, a target material is heated, and a semiconductor-containing gas is supplied. If the environment is properly maintained, the semiconductor precipitates out of the gas and on to the target in a controlled manner. In particular, the rate of precipitation/deposition depends on the surface temperature of the target material, as well as the supply rate of the gas or gasses and pressure within the epitaxial chamber. Epitaxy is capable of producing layers of highly uniform thickness; however minute deviations that may be perfectly acceptable in one technology may be critical defects once the design node shrinks. Accordingly, while conventional systems and techniques of epitaxial deposition have been adequate for previous designs, they may not be able to meet the needs of the next generation of integrated circuits. In order to continue to meet ever-increasing design requirements, further advances are needed in this area and others.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
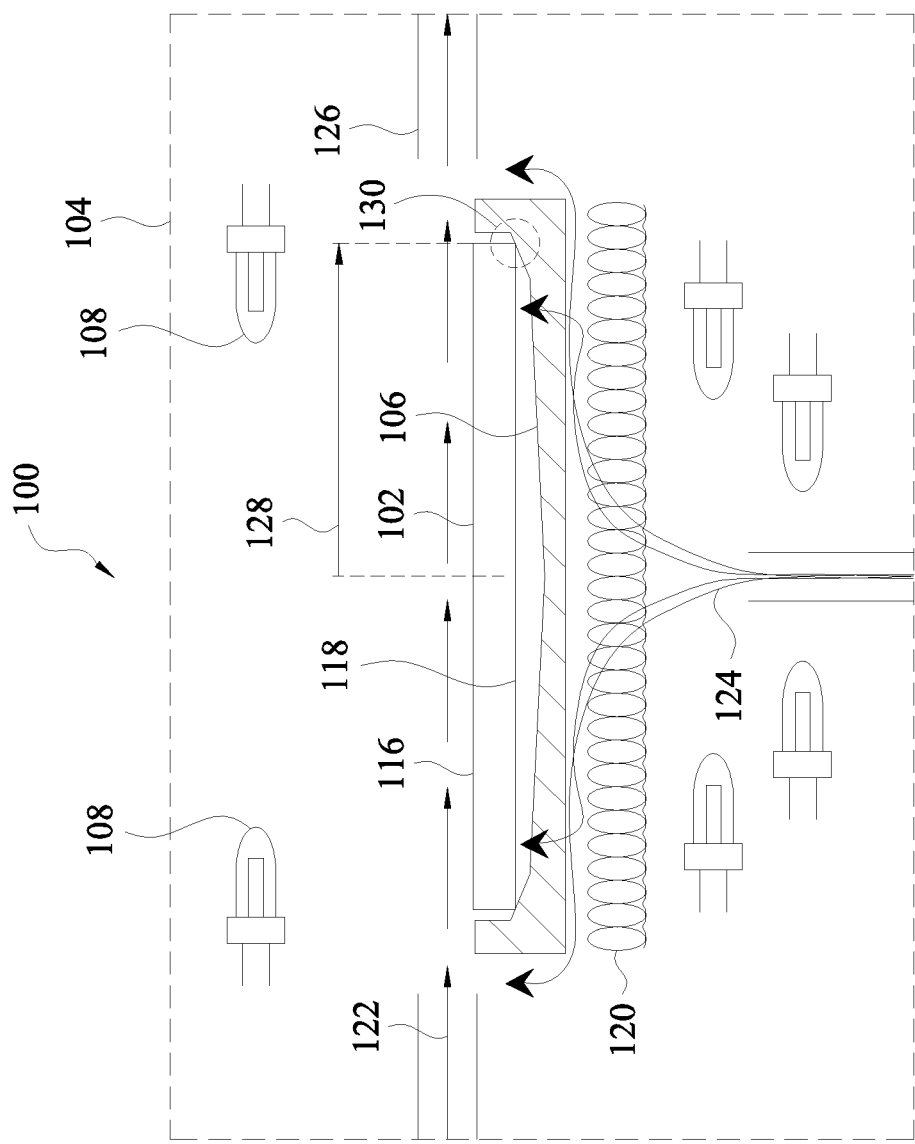
FIG. 1 is a schematic view of an epitaxial system according to various aspects of the present disclosure.

The present disclosure relates generally to IC device manufacturing and, more particularly, to a system and technique for epitaxial deposition with improved thermal uniformity.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

FIG. 1 is a schematic view of an epitaxial system 100 according to various aspects of the present disclosure. The epitaxial system 100 is merely one example of an integrated circuit fabrication tool in which the temperature of a workpiece or substrate affects the quality of the results. The principles of the present disclosure apply equally across a wide array of fabrication tools. FIG. 1 has been simplified for the sake of clarity and to better illustrate the concepts of the present disclosure.

The epitaxial system 100 is operable to perform an epitaxial process and thereby deposit a crystalline, polycrystalline, and/or amorphous material on a substrate 102. Suitable substrates 102 encompass any workpiece used in semiconductor fabrication. For example, the substrate 102 may include bulk silicon. Alternatively, the substrate 102 may comprise an elementary (single element) semiconductor, such as silicon or germanium in a crystalline structure; a compound semiconductor, such as silicon germanium, silicon carbide, gallium arsenic, gallium phosphide, indium phosphide, indium arsenide, and/or indium antimonide; or combinations thereof. The substrate 102 may also have a silicon-on-insulator (SOI) structure and thus may include an insulator such as a semiconductor oxide, a semiconductor nitride, a semiconductor oxynitride, a semiconductor carbide, and/or other suitable insulator materials. SOI substrates are fabricated using separation by implantation of oxygen (SIMOX), wafer bonding, and/or other suitable methods. In some embodiments, the substrate 102 is a mask substrate and includes non-semiconductor materials such as quartz, LTEM glass, silicon carbide, silicon oxide, and/or titanium oxide.

The epitaxial process is performed within a central chamber 104 of the epitaxial system 100. Atmospheric controls, including filtering, maintain an environment with extremely low levels of particulates and airborne molecular contamination ("AMC"), both of which may damage a substrate 102. By creating a microenvironment within the central chamber 104, the epitaxial process can be performed in a cleaner environment than the surrounding facilities. The sealed construction of the central chamber 104 may also help to maintain pressure or temperature and to contain process gases.

Substrates 102 may arrive at the central chamber 104 after passing through a series of locks and doors designed to protect the environment of the central chamber 104 from contaminates. Once a substrate 102 has been received, it is loaded into a susceptor 106 that holds the substrate 102 in place during the epitaxial growth process. Accordingly, the susceptor 106 will be recognized as an example of a substrate-restraining device used in the fabrication of an integrated circuit. Other examples include wafer chucks and transfer mechanisms, and the principles of the present disclosure apply equally to these devices.

In addition to retaining the substrate 102, the susceptor 106 may also perform a more complicated role during the epitaxy process by affecting the temperature of the substrate 102. In order to understand this more completely, an exemplary epitaxial process will now be described in more detail. During epitaxy, the substrate 102 is heated to a suitable temperature (about 650° C. in a low-temperature example and about 1200° C. in a high-temperature example), and the central chamber 104 may include a number of different heating mechanisms for this purpose. In some embodiments, the central chamber 104 includes one or more infrared lamps 108 directed at the front surface 116 (the surface undergoing epitaxial growth) and/or the back surface 118 of the substrate 102. Additionally or in the alternative, the central chamber 104 may include one or more induction heating coils 120 disposed near to the substrate 102. The induction heating coils 120 may be separate from the susceptor 106 or may be integrated into the susceptor 106 itself. Although infrared and induction heating are some of the most common heating techniques, the principles of the present disclosure are not limited to these examples.

Once the substrate 102 is heated, various gases are provided on the substrate 102. In an example, a semiconductor-containing precursor gas 122 (e.g., $SiH_4$, $Si_2H_6$, $SiHCl_3$, etc.) is provided from an inlet across the front surface 116 of the substrate 102. A second gas, a carrier gas 124, (e.g., $H_2$, $N_2$, etc.) is provided around the substrate 102. In some examples, the carrier gas 124 is provided up through ports in the susceptor 106. The gasses react, and the semiconductor of the precursor gas 122 is deposited the front surface 116 of the substrate 102 in an orderly crystalline structure. The carrier gas 124 may catalyze the reaction of the precursor gas 122 and may carry the resultant products away from the substrate 102. Remaining gases and the resulting gaseous products are exhausted through an exhaust port 126.

Figure 2:
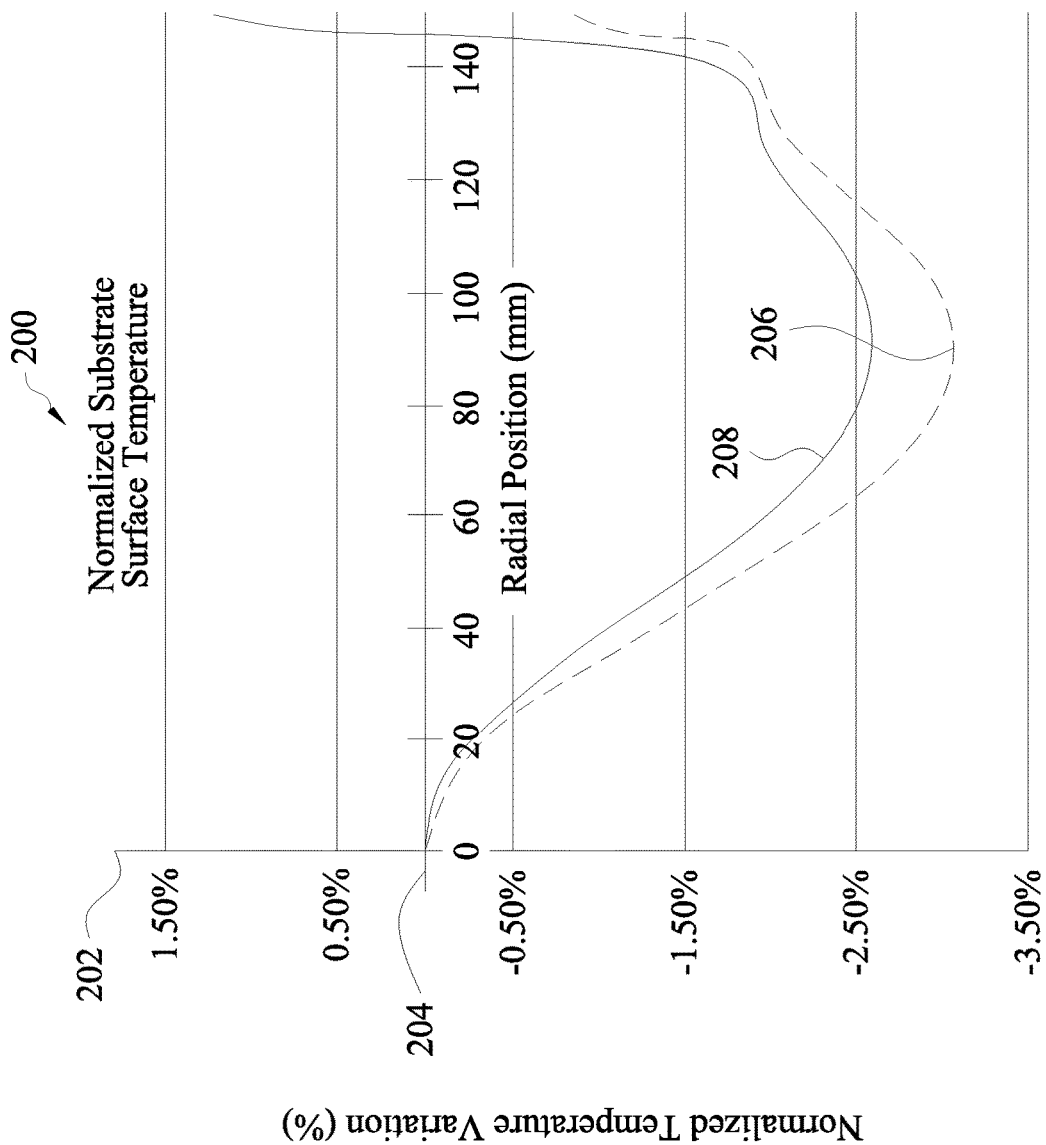
FIG. 2 is a plot of observed thermal characteristics of an epitaxial process according to various aspects of the present disclosure.

Referring to FIG. 1 and to FIG. 2, it has been determined through experimentation that in many epitaxial systems 100 and other fabrication tools, the substrate 102 is heated unevenly despite a uniform distribution of heating elements. FIG. 2 is a plot 200 of observed thermal characteristics of an epitaxial process according to various aspects of the present disclosure. In particular, temperature (represented as a normalized temperature along axis 202) of the substrate 102 measured at the front surface 116 drops off radially extending outward from the center of the substrate (indicated by axis 204 of FIG. 2 and arrow 128 of FIG. 1). Then, the temperature increases sharply near the point of contact between the substrate 102 and the susceptor 106 (indicated by circle 130 of FIG. 1). This effect may be exacerbated through the use of certain carrier gases 124. For example, line 206 represents a temperature curve measured in an epitaxial process utilizing hydrogen ($H_2$) as a carrier gas 124 and shows a modest increase at the point of contact. In contrast, line 208 represents a temperature curve measured in an epitaxial process utilizing nitrogen ($N_2$) as a carrier gas 124 and has a more dramatic temperature increase. Because epitaxial processes are generally temperature sensitive, the spike caused by the point of contact 130 may have an unacceptably large effect on the amount of epitaxial material grown on the substrate 102. For this reason and others, the embodiments that follow describe alternative susceptor configurations intended to reduce thermal conduction at the point of contact between the substrate 102 and the susceptor 106.

Figure 3:
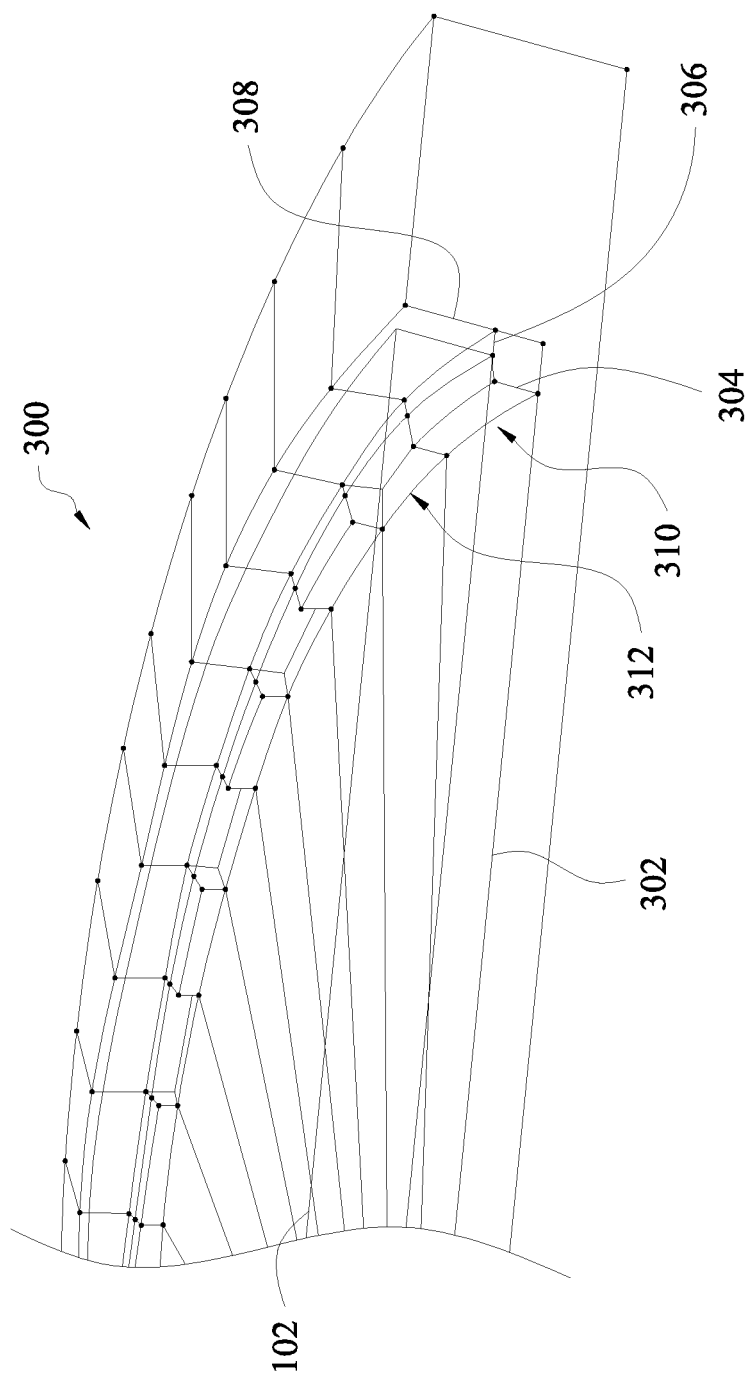
FIG. 3 is a cross-sectional diagram of a portion of a susceptor according to various aspects of the present disclosure.

FIG. 3 is a cross-sectional diagram of a portion of a susceptor 300 according to various aspects of the present disclosure. The susceptor 300 is suitable for use with any integrated circuit fabrication tool including the epitaxial system 100 described with reference to FIG. 1. For context, the susceptor 300 is shown with a retained substrate 102, which is represented by a translucent figure to avoid obscuring details of the susceptor 300. The susceptor 300 may include any suitable material, and in many embodiments, the susceptor 300 materials are selected to limit heat transfer while withstanding high temperatures. For example, the susceptor 300 may include graphite, silicon carbide, quartz, and/or other suitable materials, and in an exemplary embodiment, includes silicon-carbide-coated graphite.

The susceptor 300 includes a first surface 302 having a circular shape (i.e., a disk). In some embodiments, the first surface 302 is slightly conical having an apex (not shown) that is aligned with the center of the retained substrate 102 and that is further away from the retained substrate 102 than the outer perimeter of the circular surface 302. In other words, the first surface 302 may slope upwards towards the retained substrate 102 at the outer edge of the first surface 302.

Instead of a solid contact region, the susceptor 300 includes a number of contact regions 310 arranged radially at the outer perimeter of first surface 302 and interleaved with noncontact regions 312, also arranged radially at the perimeter of the first surface 302. The susceptor 300 may include any number of contact regions 310 provided sufficient contact is made between the susceptor 300 and the retained substrate 102 to secure the substrate 102. The contact regions 310 and noncontact regions 312 may have any suitable lengths (technically, arc lengths), and in some exemplary embodiments, the contact regions 310 and noncontact regions 312 are selected to have substantially equivalent arc lengths. Similarly, the contact regions 310 may be arranged at any interval and may be arranged equally or unequally along the perimeter of the first surface 302. In one exemplary embodiment, sixty contact regions 310 are arranged around the perimeter of the first surface 302, with sixty intervening noncontact regions 312. In various other exemplary embodiments, the susceptor 300 includes between two and sixty contact regions 310 and an equal number of noncontact regions 312.

Within each of the contact regions 310, a second surface 304 arises substantially perpendicular from the first surface 302 and directed towards the retained substrate 102. The second surface 304 meets a third surface 306 at an angle of about or slightly greater than 90°. This third surface 306 serves as the contact surface between the susceptor 300 and the retained substrate 102. To reduce the contact area, the third surface 306 may extend slightly upward such that the portion radially outward is higher than the portion radially inward. The third surface 306 extends radially outward past the perimeter of the retained substrate 102 to an outer region of the susceptor 300. In the illustrated embodiment, the outer region of the susceptor is defined in part by a cylindrical fourth surface 308, which extends upward towards the retained substrate 102. This configuration may assist in the proper alignment of the retained substrate 102 on the susceptor 300. The fourth surface 308 may extend past the retained substrate 102 in the vertical direction, or may terminate at a height substantially coplanar with the topmost surface (e.g., front surface 116) of the substrate 102.

Within the noncontact regions 312, the first surface 302 extends further radially than in the contact regions 310 such that the first surface 302 in these regions 312 extends past the substrate 102 to the outer region of the susceptor 300. In the illustrated embodiment, the first surface 302 in the noncontact regions 312 extends to the fourth surface 308 and intersects the fourth surface 308 at an angle of about 90°.

The susceptor 300 has several advantages over a comparable susceptor having a solid contact region. For example, because of the noncontact regions 312, the surface area of the retained substrate 102 in contact with the susceptor 300 is reduced. In turn, this reduces the transfer of heat from the susceptor 300 to the retained substrate 102. In addition, the noncontact regions 312 may allow gases, such as the carrier gas 124, to flow between the substrate 102 and the susceptor 300, further regulating substrate 102 temperature. It is understood that these advantages are merely exemplary, and no advantage is required for any particular embodiment.

Figure 4:
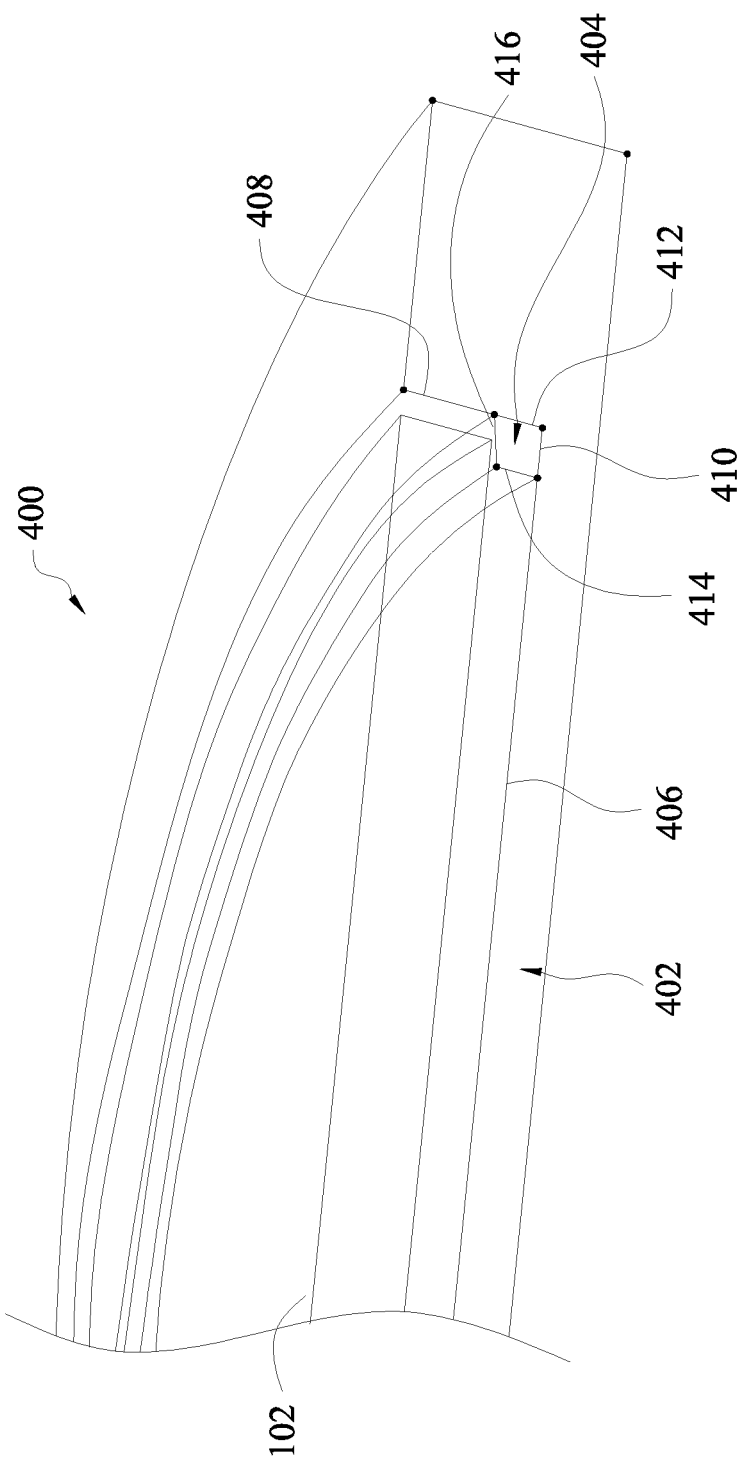
FIG. 4 is a cross-sectional diagram of a portion of a susceptor having a separate contact ring according to various aspects of the present disclosure.

In some embodiments, thermal conduction is reduced by separating the contact portion from the remainder of the susceptor. For example, FIG. 4 is a cross-sectional diagram of a portion of a susceptor 400 having a separate contact ring according to various aspects of the present disclosure. The susceptor 400 is suitable for use with any integrated circuit fabrication tool including the epitaxial system 100 described with reference to FIG. 1. For context, the susceptor 400 is shown with a retained substrate 102, which is represented by a translucent figure to avoid obscuring details of the susceptor 400.

In contrast to the previous examples, susceptor 400 has two separate portions, a base portion 402 and a contact ring 404. The interface between the base portion 402 and the contact ring 404 may be configured to reduce heat transfer to the contact ring 404 and thereby to the substrate 102. To enhance this effect, the base portion 402 and the contact ring 404 may include different materials. For example, while each of the base portion 402 and the contact ring 404 may include graphite, silicon carbide, quartz, and/or other suitable materials, in an embodiment, the base portion 402 includes silicon-carbide-coated graphite, while the contact ring 404 is pure silicon carbide. Because the weight of the substrate 102 does not impart a shear force on the contact ring 404 in the way it does the base portion 402, in some embodiments, better insulating materials may be used to form the contact ring 404, even if the materials tend to be brittle.

The base portion 402 of the susceptor 400 includes a first surface 406 having a circular shape. In some embodiments, the first surface 406 is slightly conical having an apex that is aligned with the center of the retained substrate 102 and that is further away from the retained substrate 102 than the outer perimeter of the circular surface 406. The first surface 406 may extend beyond the perimeter of the retained substrate 102 to the outer region of the susceptor 400, which in the illustrated embodiment includes a cylindrical second surface 408. The exemplary second surface 408 arises substantially perpendicular from the first surface 406 directed towards the retained substrate 102, and may extend past the retained substrate 102 in the vertical direction, or may terminate at a height substantially coplanar with the topmost surface of the substrate 102.

The contact ring 404 sits within the base portion 402 and has two surfaces 410 and 412 arranged to contact the first surface 406 and the second surface 408 of the base portion 402 at the perimeter of the first surface 406. The contact ring 404 also has a third surface 414 that arises substantially perpendicular from the first surface 406 of the base portion 402 and that is directed towards the retained substrate 102. The third surface 414 meets a fourth surface 416 at an angle of about or slightly greater than 90°. This fourth surface 416 serves as the contact point between the susceptor 400 and the retained substrate 102. Accordingly, to reduce the contact area, the fourth surface 416 may extend slightly upward such that the portion radially outward is higher than the portion radially inward. Because the retained substrate contacts the contact ring 404 and because of the interface between the contact ring 404 and the base portion 402, the transfer of thermal energy to the substrate 102 may be reduced.

Figure 5:
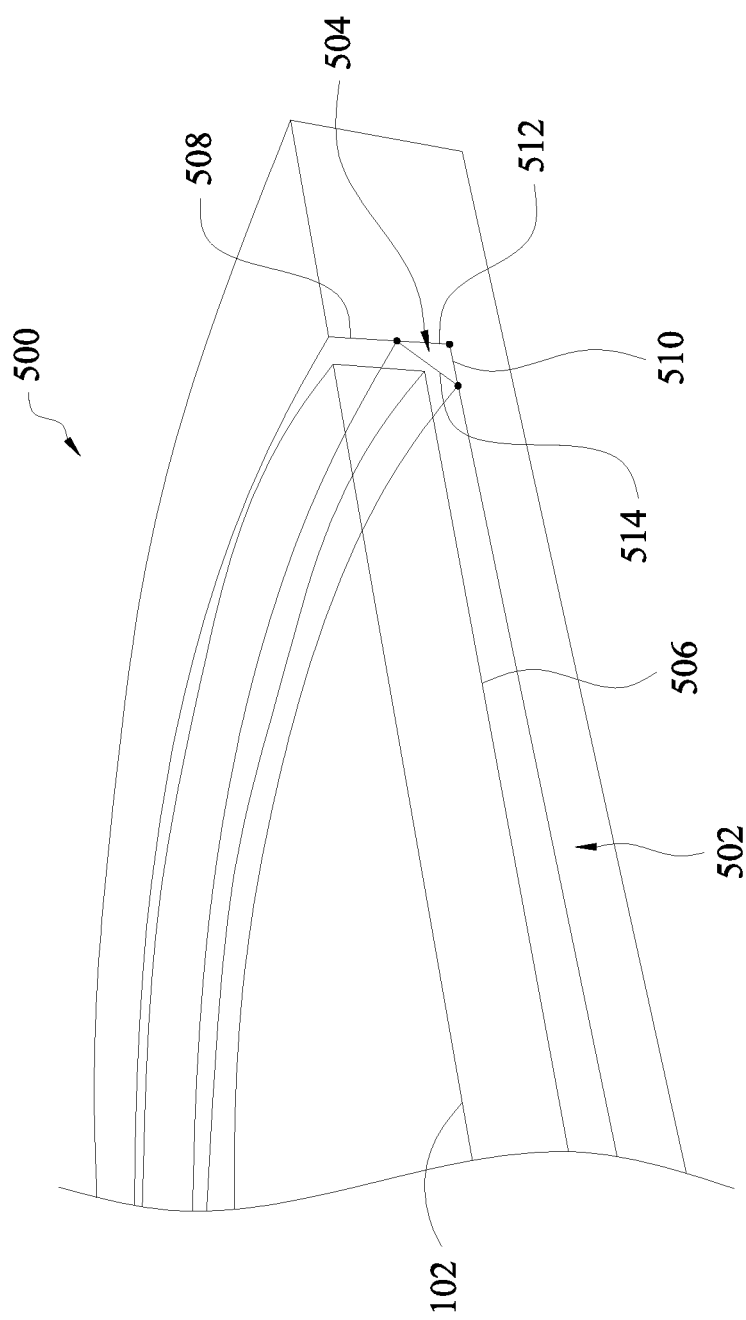
FIG. 5 is a cross-sectional diagram of a portion of a susceptor having a three-sided contact ring according to various aspects of the present disclosure.

While the contact ring 404 shown in FIG. 4 has a four-sided profile, in further embodiments, the contact ring 404 has different configurations such as a three-sided profile or a circular profile. For example, FIG. 5 is a cross-sectional diagram of a portion of a susceptor 500 having a three-sided contact ring according to various aspects of the present disclosure. The susceptor 500 is suitable for use with any integrated circuit fabrication tool including the epitaxial system 100 described with reference to FIG. 1. For context, the susceptor 500 is shown with a retained substrate 102, which is represented by a translucent figure to avoid obscuring details of the susceptor 500.

Susceptor 500 is a two-part device, similar to the embodiments of susceptor 400, where the contact ring 504 has three surfaces rather than four, and where the contact surface of the contact ring 504 extends up from the first surface of the base portion. In that regard, similar to susceptor 400 of FIG. 4, susceptor 500 has two separate portions, a base portion 502 and a contact ring 504, which may include different materials. For example, while each of the base portion 502 and the contact ring 504 may include graphite, silicon carbide, quartz, and/or other suitable materials, in an embodiment, the base portion 502 includes silicon-carbide-coated graphite, while the contact ring 504 is pure silicon carbide.

The base portion 502 of the susceptor 500 may be similar to the base portion 402 of susceptor 400. For example, the base portion 502 may include a first surface 506 having a circular shape. In some embodiments, the first surface 506 is slightly conical having an apex that is aligned with the center of the retained substrate 102 and that is further away from the retained substrate 102 than the outer perimeter of the circular surface 506. The first surface 506 may extend beyond the perimeter of the retained substrate 102 to the outer region of the susceptor 500, which in the illustrated embodiment includes a cylindrical second surface 508. The exemplary second surface 508 arises substantially perpendicular from the first surface 506 directed towards the retained substrate 102, and may extend past the retained substrate 102 in the vertical direction, or may terminate at a height substantially coplanar with the topmost surface of the substrate 102.

The contact ring 504 sits within the base portion 502 and has two surfaces 510 and 512 arranged to contact the first surface 506 and the second surface 508 of the base portion 502 at the perimeter of the first surface 506. However, instead of a vertical surface arising perpendicular from surface 506, the contact ring 504 has a contact surface 514 that extends from the second surface 506 of the base portion 502. This increases the angle at the point of contact between the contact ring 504 and the retained substrate 102. Accordingly, the contact surface 514 extends upward such that the portion radially outward is higher than the portion radially inward. Similar to the examples of FIG. 4, because the retained substrate 102 contacts the contact ring 504 and because of the interface between the contact ring 504 and the base portion 502, the transfer of thermal energy to the substrate 102 may be reduced.

Figure 6:
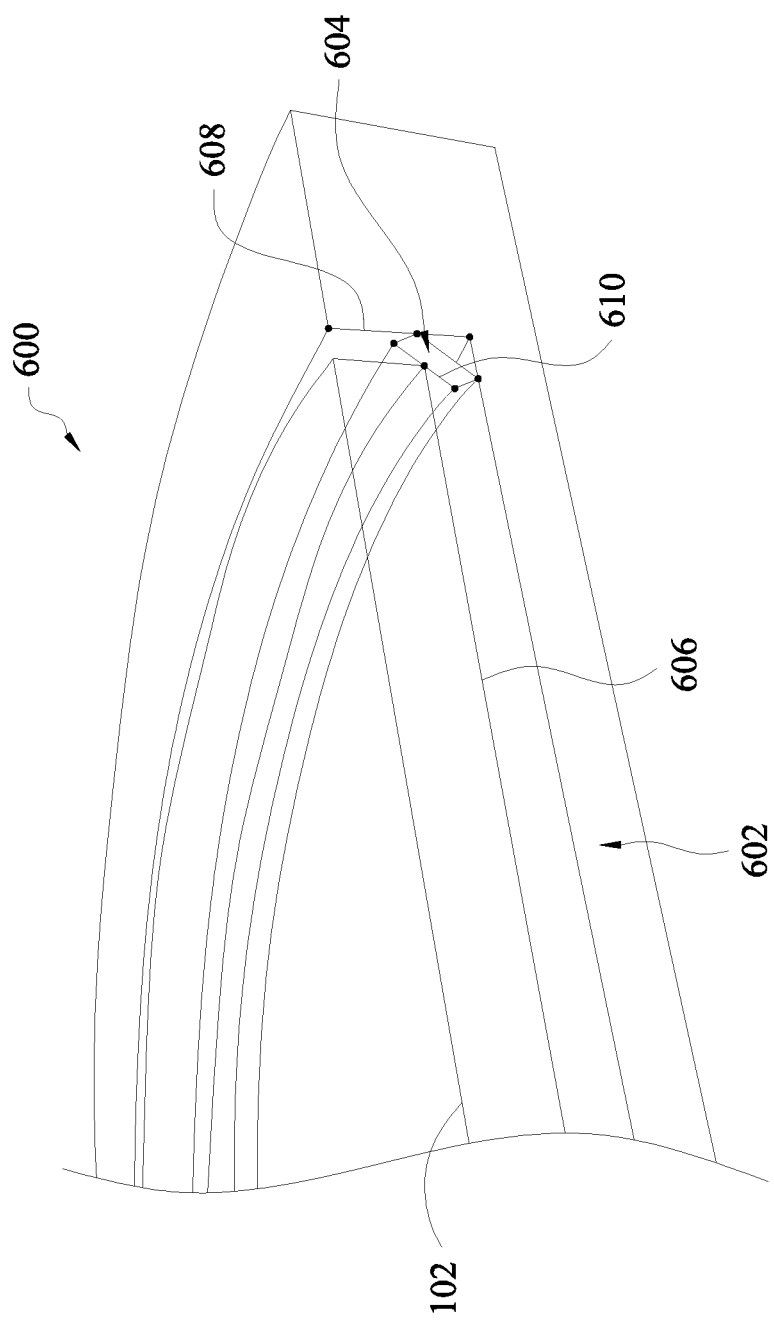
FIG. 6 is a cross-sectional diagram of a portion of a susceptor having a separate contact ring according to various aspects of the present disclosure.

FIG. 6 is a cross-sectional diagram of a portion of a susceptor 600 having a separate contact ring according to various aspects of the present disclosure. The susceptor 600 is suitable for use with any integrated circuit fabrication tool including the epitaxial system 100 described with reference to FIG. 1. For context, the susceptor 600 is shown with a retained substrate 102, which is represented by a translucent figure to avoid obscuring details of the susceptor 600.

Susceptor 600 also has a base portion 602 and a contact ring 604. In previous examples, the boundary between the base portion and the contact ring may reduce heat transfer to the contact ring and thereby to the substrate 102. This effect is further enhanced in susceptor 600 by limiting the physical contact between the base portion 602 and the contact ring 604, as discussed in more detail below. Each of the base portion 602 and the contact ring 604 may include graphite, silicon carbide, quartz, and/or other suitable materials, and in an embodiment, the base portion 602 includes silicon-carbide-coated graphite, while the contact ring 604 is pure silicon carbide.

The base portion 602 of the susceptor 600 includes a first surface 606 having a circular shape. In some embodiments, the first surface 606 is slightly conical having an apex that is aligned with the center of the retained substrate 102 and that is further away from the retained substrate 102 than the perimeter of the first surface 606. The first surface 606 may extend beyond the perimeter of the retained substrate 102 to the outer region of the susceptor 600, which in the illustrated embodiment includes a cylindrical second surface 608. The exemplary second surface 608 arises substantially perpendicular from the first surface 606 directed towards the retained substrate 102, and may extend past the retained substrate 102 in the vertical direction, or may terminate at a height substantially coplanar with the topmost surface of the substrate 102.

The contact ring 604 sits within the base portion 502 and has two sets of parallel surfaces (including contact surface 610) arranged to form a toroid with a rectangular cross section. Because the surfaces of the contact ring 604 do not align with the surfaces of the base portion 602, the surface area at the interface between the base portion 602 and the contact ring 604 is dramatically reduced. Separating the base portion 602 and the contact ring 604 in this manner may reduce the transfer of heat to the contact ring 604 and to the substrate 102. In addition, an insulating air gap may be formed between the base portion 602 and the contact ring 604, further reducing heat transfer.

Figure 7A:
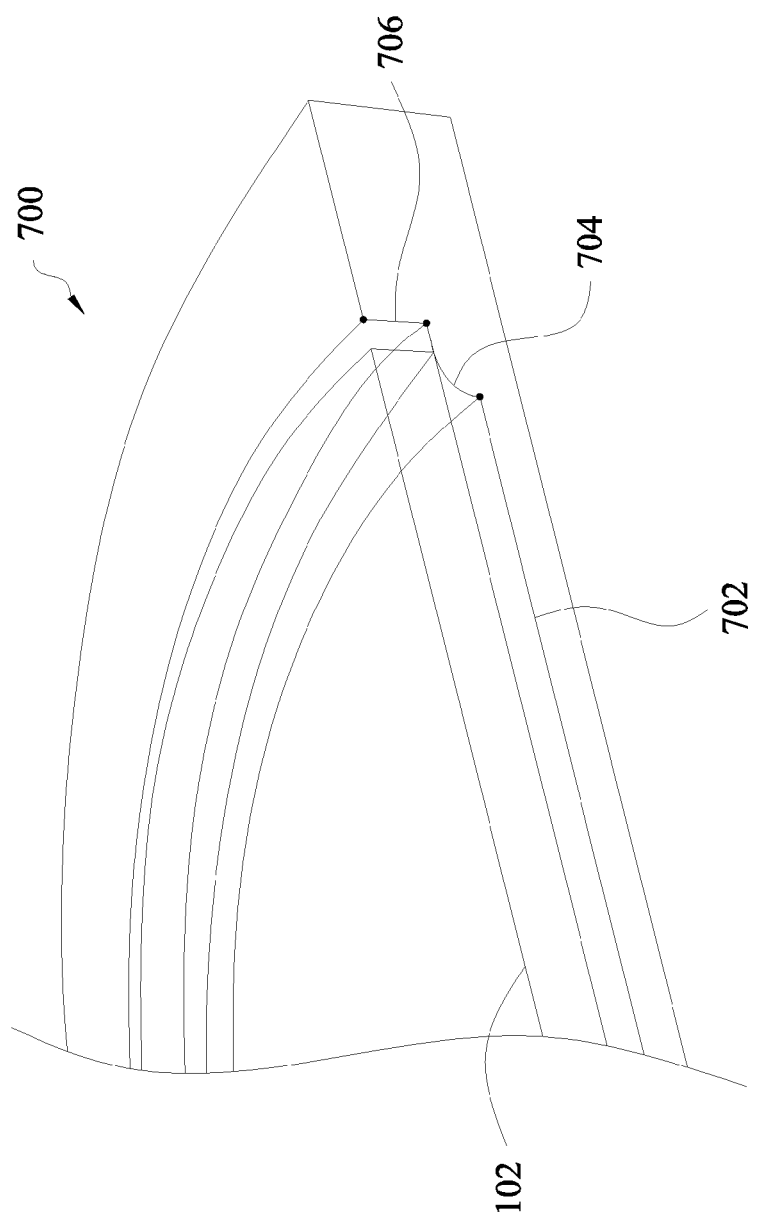
FIGS. 7A and 7B are cross-sectional diagrams of a portion of a susceptor having a toroidal contact surface according to various aspects of the present disclosure.
Figure 7B:
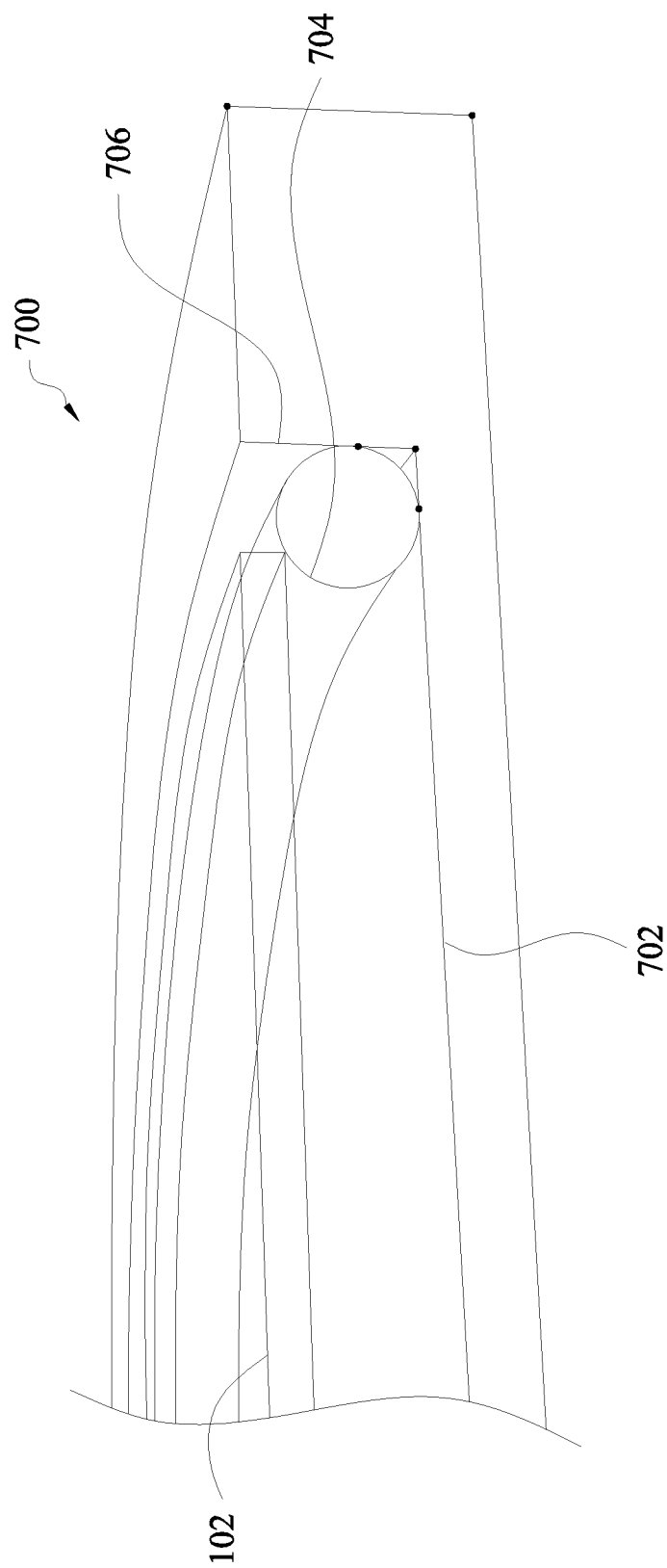

In further examples, a variety of different contact surface shapes is used in order to insulate the retained substrate 102. FIGS. 7A and 7B are cross-sectional diagrams of a portion of a susceptor 700 having a toroidal contact surface according to various aspects of the present disclosure. The susceptor 700 is suitable for use with any integrated circuit fabrication tool including the epitaxial system 100 described with reference to FIG. 1. For context, the susceptor 700 is shown with a retained substrate 102, which is represented by a translucent figure to avoid obscuring details of the susceptor 700. The susceptor 700 may include any suitable material, and in various embodiments includes graphite, silicon carbide, quartz, silicon-carbide-coated graphite, and/or other suitable materials.

The susceptor 700 includes a first surface 702 having a circular shape. In some embodiments, the first surface 702 is slightly conical having an apex that is aligned with the center of the retained substrate 102 and that is further away from the retained substrate 102 than the perimeter of the surface 702. Near the outer edge of the substrate 102, the first surface 702 meets a curvilinear second surface 704 that defines a portion of a toroid. In the illustrated embodiment of FIG. 7A, the second surface 704 defines approximately one quarter of a toroid. In the illustrated embodiment of FIG. 7B, the second surface 704 defines a complete toroid and defines an air gap between the toroid and inner surfaces of the susceptor 700. These are merely examples at two extremes, and in further embodiments, the second surface 704 defines various portions of a toroid falling between the quarter toroid examples of FIG. 7A and the complete toroid examples of FIG. 7B. In each of these examples, it is the curvilinear second surface 704 that contacts the retained substrate 102. Incorporating a curvilinear contact surface rather than a planar surface may reduce the contact area between the susceptor 700 and the substrate 102 and may promote better gas circulation around the substrate 102. In addition, the air gap present in the examples of FIG. 7B may further insulate the substrate 102.

In any of these configurations, the second surface 704 may extend beyond the perimeter of the retained substrate 102 to the outer region of the susceptor 700, which in the illustrated embodiment includes a cylindrical second surface 708. The exemplary second surface 708 may extend past the retained substrate 102 in the vertical direction, or may terminate at a height substantially coplanar with the topmost surface of the substrate 102.

Figure 8:
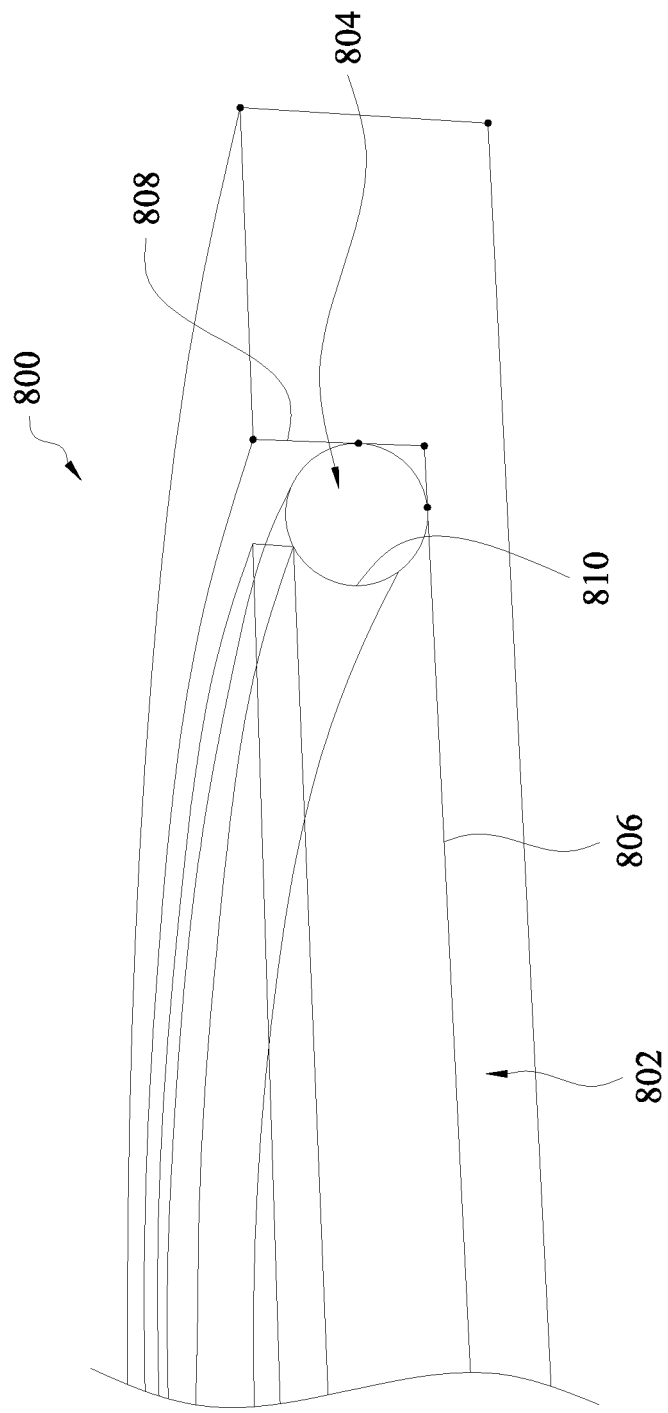
FIG. 8 is a cross-sectional diagram of a portion of a susceptor having a separate toroidal contact ring according to various aspects of the present disclosure.

The toroidal contact surface may be utilized in a two-part susceptor configuration. For example, FIG. 8 is a cross-sectional diagram of a portion of a susceptor 800 having a separate toroidal contact ring according to various aspects of the present disclosure. The susceptor 800 is suitable for use with any integrated circuit fabrication tool including the epitaxial system 100 described with reference to FIG. 1. For context, the susceptor 800 is shown with a retained substrate 102, which is represented by a translucent figure to avoid obscuring details of the susceptor 800.

Similar to previous examples, susceptor 800 has a base portion 802 and a contact ring 804. Each of the base portion 802 and the contact ring 804 may include graphite, silicon carbide, quartz, and/or other suitable materials, and in an embodiment, the base portion 802 includes silicon-carbide-coated graphite, while the contact ring 804 is pure silicon carbide. The base portion 802 of the susceptor 800 includes a first surface 806 having a circular shape, which is slightly conical in some embodiments. The first surface 806 may extend beyond the perimeter of the retained substrate 102 to the outer region of the susceptor 800, which in the illustrated embodiment includes a cylindrical second surface 808. The exemplary second surface 808 arises substantially perpendicular from the first surface 806 directed towards the retained substrate 102, and may extend past the retained substrate 102 in the vertical direction, or may terminate at a height substantially coplanar with the topmost surface of the substrate 102.

The contact ring 804 sits within the base portion 802 and has a single curvilinear surface 810 that defines a toroid. The curvilinear surface 810 contacts the substrate 102, the first surface 806 of the base portion 802, and the second surface 808 of the base portion 802. In some embodiments, the surface 810 of the contact ring 804 defines an air gap between the contact ring 804 and the base portion 802. Configured in this way, the susceptor shares many of the advantages described above. For example, the minimal contact area between the contact ring 804 and the base portion 802 may reduce heat transfer from the base portion 802, and the air gap may further insulate the contact ring 804.

Figure 9A:
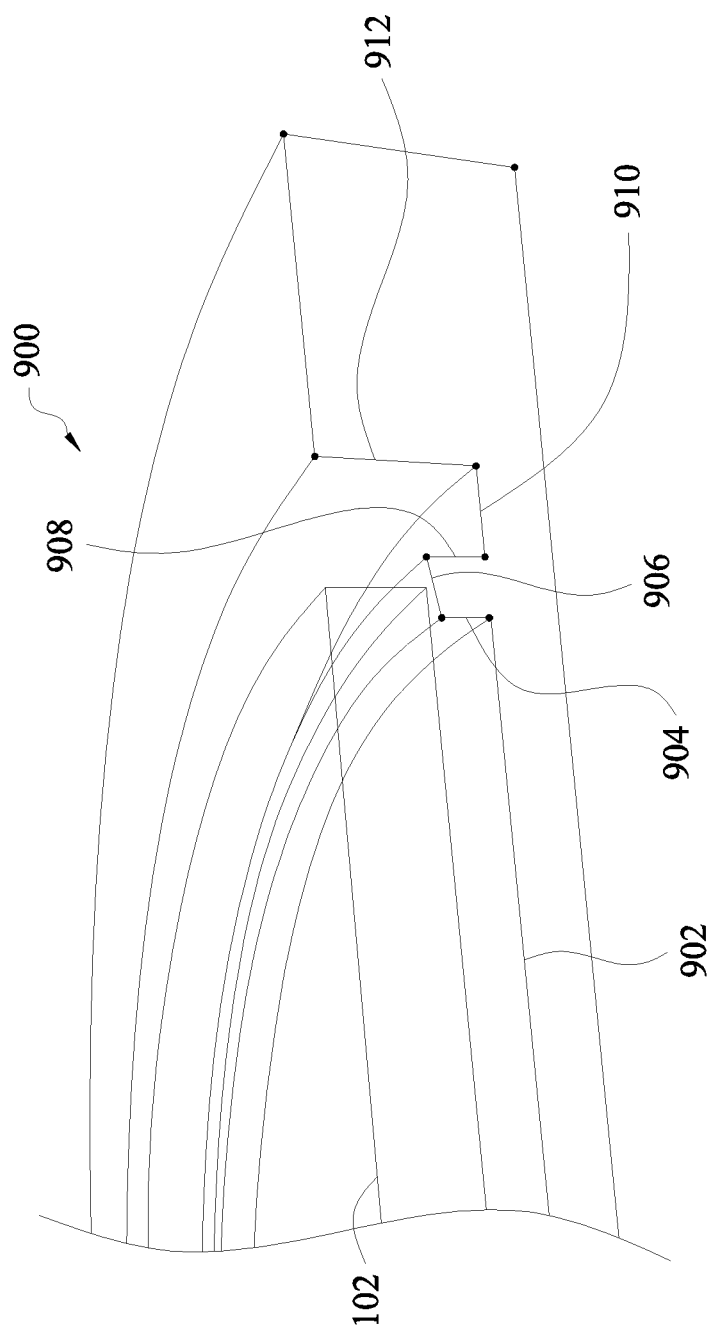
FIGS. 9A and 9B are cross-sectional diagrams of a portion of a susceptor with an exposed contact region according to various aspects of the present disclosure.
Figure 9B:
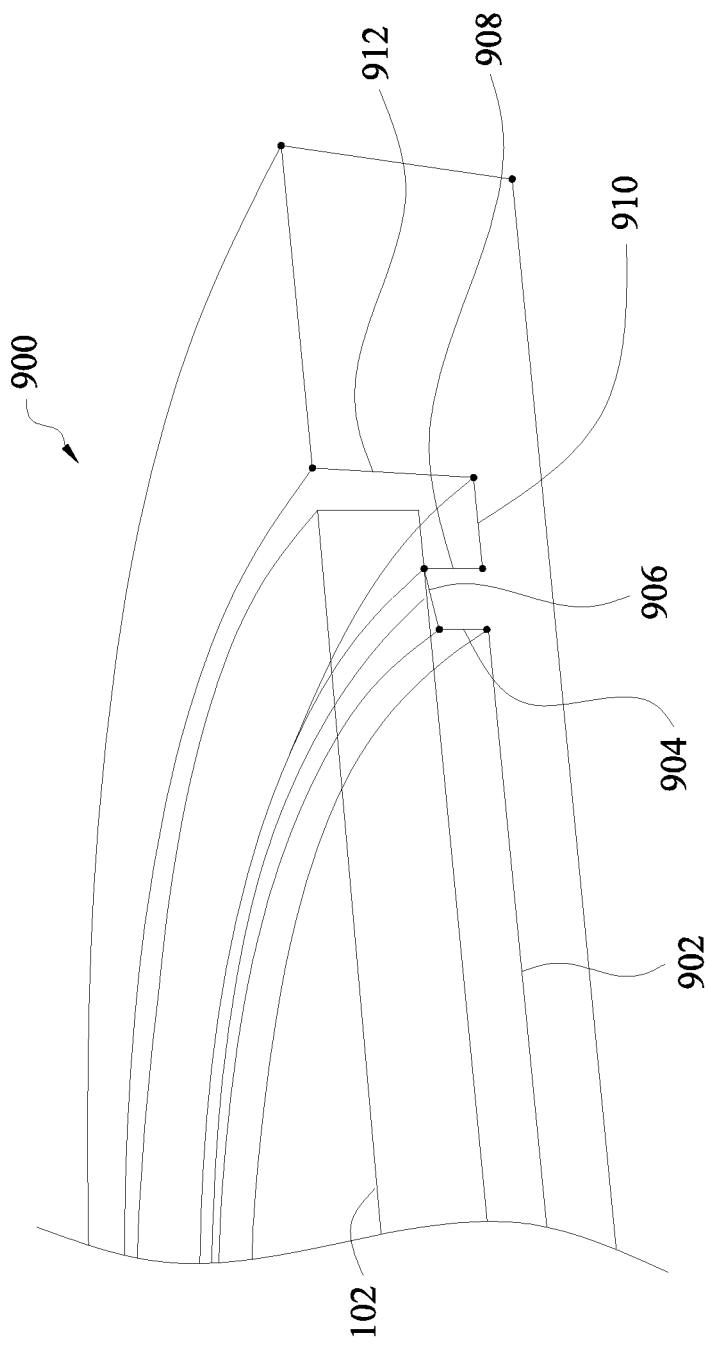

In some embodiments, the contact surface is moved inward to promote airflow around the contact surface and the substrate 102. FIGS. 9A and 9B are cross-sectional diagrams of a portion of a susceptor 900 with an exposed contact region according to various aspects of the present disclosure. The susceptor 900 is suitable for use with any integrated circuit fabrication tool including the epitaxial system 100 described with reference to FIG. 1. For context, the susceptor 900 is shown with a retained substrate 102, which is represented by a translucent figure to avoid obscuring details of the susceptor 900. The susceptor 900 may include any suitable material, such as graphite, silicon carbide, quartz, silicon-carbide-coated graphite, and/or other suitable materials.

Referring first to FIG. 9A, the susceptor 900 includes a first surface 902 having a circular shape, which in some embodiments, is slightly conical having an apex aligned with the center of the retained substrate 102 that is further away from the retained substrate 102 than the perimeter of the first surface 902. A second surface 904 arises substantially perpendicular from the first surface 902 and directed towards the retained substrate 102. The second surface 904 meets a third surface 906 at an angle of about or slightly greater than 90°. This third surface 906 serves as the contact surface between the susceptor 900 and the retained substrate 102. To reduce the contact area, the third surface 906 may extend slightly upward such that the portion radially outward is higher than the portion radially inward.

In contrast to previous examples, the third surface 906 does not extend to the outer region of the susceptor 900. Instead, a fourth surface 908 extends from the third surface back towards the bulk of the susceptor 900. This creates additional exposed surface area and may help regulate the temperature of the third surface 906. A fifth surface 910, which may be substantially coplanar (or co-conical) with the first surface 902, extends from the fourth surface 908 to the outer region of the susceptor 900, which in the illustrated embodiment includes a cylindrical sixth surface 912. The exemplary sixth surface 912 arises substantially perpendicular from the first surface 902 directed towards the retained substrate 102, and may extend past the retained substrate 102 in the vertical direction, or may terminate at a height substantially coplanar with the topmost surface of the substrate 102.

This arrangement has the effect of moving the contact surface (i.e., third surface 906) in from the outer region of the susceptor and exposes more of the surface area around the contact surface to the process gasses. Because the contact surface (i.e., third surface 906) is free of this outer region, contact between the third surface 906 and the substrate 102 need not occur at the perimeter of the substrate 102. For example, in the embodiments of FIG. 9B, which may be substantially similar to those of FIG. 9A in other aspects, the third surface 906 is moved inward with respect to the substrate 102 to make contact with an inner region of the substrate 102. Because the radius of the contact surface is reduced, the contact area between the third surface 906 and the substrate 102 is also reduced. This may have the effect of reducing heat transfer to the substrate 102.

Figure 10A:
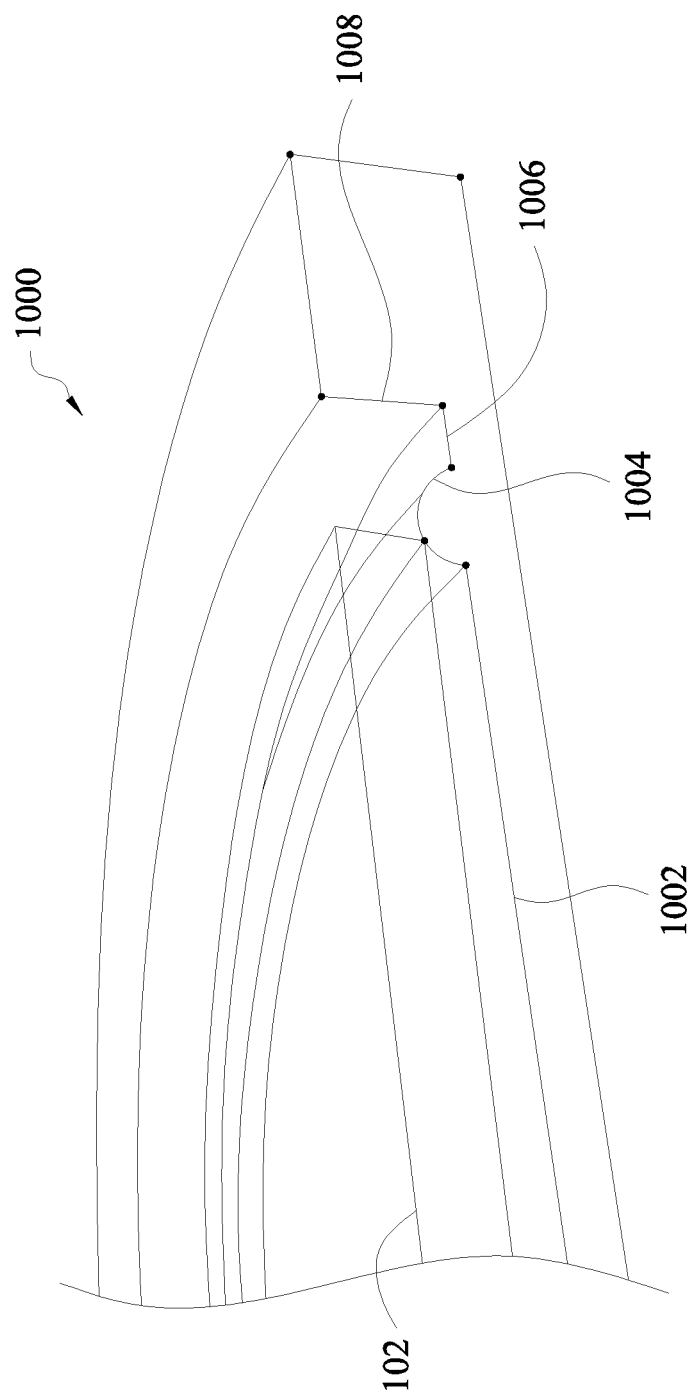
FIGS. 10A and 10B are cross-sectional diagrams of a portion of a susceptor with an exposed toroidal contact region according to various aspects of the present disclosure.
Figure 10B:
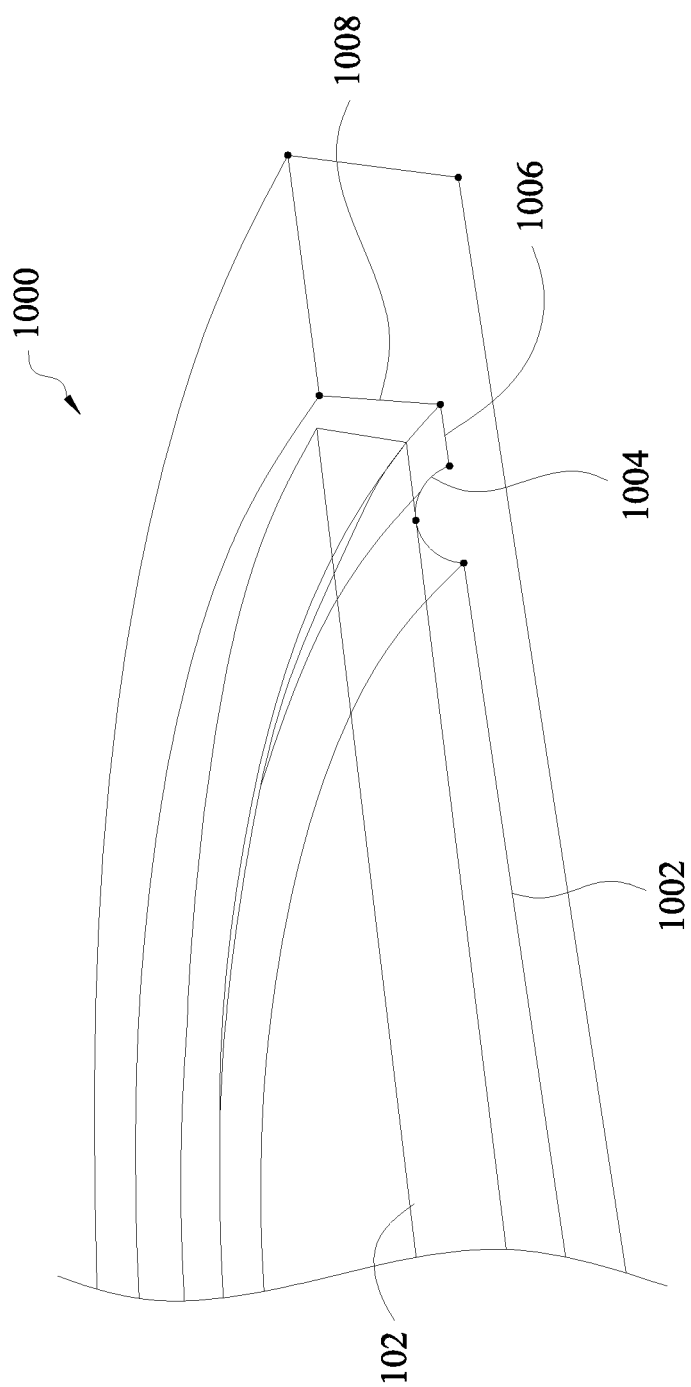

FIGS. 10A and 10B are cross-sectional diagrams of a portion of a susceptor 1000 with an exposed toroidal contact region according to various aspects of the present disclosure. The susceptor 1000 is suitable for use with any integrated circuit fabrication tool including the epitaxial system 100 described with reference to FIG. 1. For context, the susceptor 1000 is shown with a retained substrate 102, which is represented by a translucent figure to avoid obscuring details of the susceptor 1000. The susceptor 1000 may include any suitable material, such as graphite, silicon carbide, quartz, silicon-carbide-coated graphite, and/or other suitable materials.

Referring first to FIG. 10A, the susceptor 1000 includes a first surface 1002 having a circular shape, which in some embodiments, is slightly conical having an apex aligned with the center of the retained substrate 102 and that is further away from the retained substrate 102 than the perimeter of the first surface 1002. A curvilinear second surface 1004 arises from the first surface 1002. In the illustrated embodiment of FIG. 10A, the second surface 704 defines approximately a half toroid. The curvilinear second surface 1004 contacts the retained substrate 102, and its shape may reduce the contact area between the susceptor 1000 and the substrate 102 and promote better gas circulation around the substrate 102.

In the illustrated embodiment, the second surface 1004 does not extend to the outer region of the susceptor 1000. Instead, it meets a third surface 1006, which may be substantially coplanar (or co-conical) with the first surface 1002, that extends from the second surface 1004 to the outer region of the susceptor 1000. In the illustrated embodiment, the outer region of the susceptor is defined in part by a cylindrical fourth surface 1008, which extends upward towards and past the retained substrate 102. The fourth surface 1008 may extend past the retained substrate 102 in the vertical direction, or may terminate at a height substantially coplanar with the topmost surface (e.g., front surface 116) of the substrate 102.

Because the contact surface (i.e., second surface 1004) is free of this outer region, contact between the second surface 1004 and the substrate 102 need not occur at the perimeter of the substrate. For example, in the embodiments of FIG. 10B, which may be substantially similar to those of FIG. 10A, the second surface 1004 is moved inward with respect to the substrate 102. Because the radius of the contact surface is reduced, the contact area between the second surface 1004 and the substrate is also reduced. This may have the effect of reducing heat transfer to the substrate 102.

The preceding disclosure provides a number of exemplary embodiments and a number of representative advantages. For brevity, only a limited number of combinations of relevant features have been described. However, it is understood that features of any example may be combined with features of any other example. Furthermore, it is understood that these advantages are nonlimiting and no particular advantage is characteristic of or required for any particular embodiment.

Thus, the present disclosure provides a system and device for epitaxy that provides more uniform heating of a substrate undergoing the epitaxial process. In some embodiments, a substrate-retaining device is provided. The device includes a substantially circular first surface with a defined perimeter, a plurality of contact regions disposed at the perimeter, and a plurality of noncontact regions also disposed at the perimeter. The contact regions are interspersed with the noncontact regions. Within each of the noncontact regions, the first surface extends past where the first surface ends within each of the contact regions. In some such embodiments, each region of the plurality of contact regions includes a contact surface disposed above the first surface. In some such embodiments, each contact surface has a portion radially outward that is higher than a portion radially inward. In some such embodiments, the device also includes a cylindrical second surface extending from the first surface in each of the noncontact regions and extending from the contact surface in the contact regions.

In further embodiments, an epitaxial system is provided. The system includes a susceptor, a heating element, an inlet for supplying a gas, and an epitaxial chamber surrounding the susceptor, the heating element, and the inlet. The susceptor includes a plurality of contact regions arranged radially and interleaved with a plurality of radially arranged noncontact regions. In some such embodiments, the susceptor further includes a bottom surface around which the contact regions and the noncontact regions are arranged, and each contact region includes a contact surface disposed above the bottom surface. In some such embodiments, each contact surface has a portion radially outward that is higher than a portion radially inward.

In yet further embodiments, a device is provided that includes a base portion and a ring portion. The base portion has a substantially circular first surface and a cylindrical surface extending from the first surface, and the ring portion is disposed within the base portion and has a contact surface defined thereupon. In some such embodiments, the contact surface is curvilinear, whereas in some such embodiments, the contact surface is planar. In some such embodiments, the base portion includes a material different from a material of the ring portion.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A substrate-retaining device comprising:
    a substantially circular first surface having a perimeter defined thereupon;
    a plurality of contact regions disposed at the perimeter; and
    a plurality of noncontact regions disposed at the perimeter and interspersed with the plurality of contact regions,
    wherein the contact regions extend above the noncontact regions towards a retained substrate,
    wherein the first surface within each of the noncontact regions extends past the first surface within each of the contact regions, and
    wherein a contact surface of each of the contact regions is configured to contact an edge of the retained substrate without contacting either of two surfaces of the retained substrate that extend from the edge.

2. The substrate-retaining device of claim 1, wherein for each contact surface, a portion radially outward is higher than a portion radially inward.

3. The substrate-retaining device of claim 1 further comprising a second surface extending from the first surface in each of the noncontact regions and, within each of the contact regions, extending from the respective contact surface.

4. The substrate-retaining device of claim 3, wherein the second surface terminates at a vertical location coplanar with a top surface of the retained substrate.

5. The substrate-retaining device of claim 1, wherein each region of the plurality of contact regions includes:
    a vertical surface that extends from the first surface at an angle of about 90° to the contact surface.

6. The substrate-retaining device of claim 5, wherein for each contact surface, a portion radially outward is higher than a portion radially inward.

7. The substrate-retaining device of claim 1, wherein each of the plurality of contact regions has an arc length that is substantially equal to an arc length of each of the plurality of non-contact regions.

8. The substrate-retaining device of claim 1, wherein the first surface is conical having an apex aligned with a center of the retained substrate, and wherein the apex is further from the retained substrate than the perimeter of the first surface is from the retained substrate.

9. A device comprising:
    a base portion having a substantially circular first surface and a cylindrical surface extending from the first surface; and
    a ring portion disposed within the base portion and having a contact surface defined thereupon,
    wherein the contact surface is configured to contact an edge of a substrate without the device contacting any surface of the substrate extending from the edge.

10. The device of claim 9, wherein the contact surface is curvilinear.

11. The device of claim 9, wherein the contact surface is planar.

12. The device of claim 9, wherein the ring portion defines an air gap between the base portion and the ring portion.

13. The device of claim 9, wherein the base portion includes a material different from a material of the ring portion.

14. A substrate-retaining device comprising:
a non-linear first surface having a perimeter defined thereupon;
a plurality of contact regions disposed at the perimeter; and
a plurality of noncontact regions disposed at the perimeter and interspersed with the plurality of contact regions,
wherein the first surface within each of the noncontact regions extends past the first surface within each of the contact regions, and
wherein each of the contact regions includes a contact surface configured to contact an edge of a retained substrate without the substrate-retaining device contacting a circumferential surface of the retained substrate extending from the edge.

15. The substrate-retaining device of claim 14, wherein the contact surface of each region of the plurality of contact regions is disposed above the first surface.

16. The substrate-retaining device of claim 15 further comprising a second surface extending from the first surface in each of the noncontact regions and, within each of the contact regions, extending from the respective contact surface.

17. The substrate-retaining device of claim 16, wherein the second surface terminates at a vertical location coplanar with a top surface of a retained substrate.

18. The substrate-retaining device of claim 14, wherein each region of the plurality of contact regions includes:
a second surface that extends from the first surface at an angle of about 90° to the contact surface.

19. The substrate-retaining device of claim 15, wherein each of the plurality of contact regions has an arc length that is substantially equal to an arc length of each of the plurality of non-contact regions.

20. The substrate-retaining device of claim 16, wherein the contact surface of each of the contact regions is sloped upward towards the retained substrate.

* * * * *